United States Patent
Lee

(10) Patent No.: US 6,228,756 B1
(45) Date of Patent: May 8, 2001

(54) METHOD OF MANUFACTURING INTER-METAL DIELECTRIC LAYER

(75) Inventor: Tong-Hsin Lee, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/371,472

(22) Filed: Aug. 10, 1999

(51) Int. Cl.[7] .................. H01L 21/76; H01L 21/4763; H01L 21/31
(52) U.S. Cl. ............... 438/619; 438/421; 438/422; 438/428; 438/595; 438/632; 438/760
(58) Field of Search .................. 438/595, 421, 438/622–624, 632, 294, 698, 295, 723, 353, 743, 355, 760, 422, 783, 427, 428, 433–438, 445, 447, 619

(56) References Cited

U.S. PATENT DOCUMENTS 5,955,786 * 9/2000 Avanzino et al. .............. 257/758
6,013,569 * 1/2000 Lur et al. ....................... 438/595
6,035,530 * 3/2000 Hong ............................ 29/885

OTHER PUBLICATIONS

Wolf, Stanley, "Silicon Processing For The VLSI Era", vol. 2, Lattice Press, p. 168, 212–217, and 335,1990.*

* cited by examiner

*Primary Examiner*—John F. Niebling
*Assistant Examiner*—Ha Tran Nguyen
(74) *Attorney, Agent, or Firm*—Thomas, Kayden, Horstemeyer & Risley

(57) ABSTRACT

A method of manufacturing an inter-metal dielectric layer. A substrate having a plurality of wires formed thereon is provided. A portion of the substrate is exposed to form an opening between the wires. The opening is filled with a flowable dielectric material, wherein a surface level of the flowable dielectric material is lower than that of the wires. A plurality of spacers is formed on the sidewall of the wires exposed by the flowable dielectric material. The flowable dielectric material is removed. An anisotropic deposition process with a poor-lateral-filling ability is performed to form a dielectric layer with a void under the spacer over the substrate.

10 Claims, 2 Drawing Sheets

METHOD OF MANUFACTURING INTER-METAL DIELECTRIC LAYER

BACKGROUND OF THE INVENTION

1. Field of Invention

The present invention relates to a method of manufacturing an inter-metal dielectric layer. More particularly, the present invention relates to a method of manufacturing an inter-metal layer which can decrease the resistor-capacitor time delay (RC time delay) in a device.

2. Description of Related Art

In the process for manufacturing an ultra large-scale integrated circuit, more than a hundred thousand transistors are located on a silicon substrate within an area of about 1–2 square centimeters. Additionally, in order to increase the integration of the integrated circuits (ICs), the density of wires used to electrically couple the transistors to each other or the other devices to each other is increased. Therefore, in accord with the increased interconnect manufacturing requirements of miniaturized MOS transistors, it is increasingly necessary for IC manufacturing to adopt a design with more than two metal layers. In particular, a number of function-complicated products, such as microprocessors, even require 4 or 5 metal layers to complete the internal connections. Generally, an inter-metal dielectric (IMD) layer is used to electrically isolate two adjacent metal layers from each other. Moreover, a conductive layer used to electrically connect the two adjacent metal layers is called a via plug in the semiconductor industry.

However, due to the increasingly high integration of ICs, the distance between the adjacent wires is decreased. If the dielectric constant of the IMD layer used an electrically isolating material between the wires can not be efficiently decreased, the rate of data transmission between the devices is decreased due to the increasing of the RC time delay. Hence, the ability of the devices is limited.

SUMMARY OF THE INVENTION

The invention provides a method of manufacturing an inter-metal dielectric layer. A substrate having a plurality of wires formed thereon is provided. A portion of the substrate is exposed to form an opening between the wires. The opening is filled with a flowable dielectric material, wherein a surface level of the flowable dielectric material is lower than that of the wires. A plurality of spacers is formed on the sidewalls of the wires exposed by the flowable dielectric material. The flowable dielectric material is removed. An anisotropic deposition process with a poor lateral-filling ability is performed to form a dielectric layer with a void under the spacer and over the substrate. Additionally, the method of manufacturing the inter-metal dielectric layer further comprises a step of forming a liner layer on the wires and the substrate before the step of filling the opening with the flowable dielectric material. Moreover, the flowable dielectric material is made of spin-on polymer or organic spin-on-glass. Furthermore, the anisotropic deposition process with a poor lateral-filling ability includes sputtering.

As embodied and broadly described herein, the invention provides a method of manufacturing an inter-metal dielectric layer with a relatively low dielectric constant. Because the inter-metal dielectric layer formed by the invention possesses a void under each spacer and the dielectric constant of the air in the void is about 1.0, the dielectric constant of the inter-metal dielectric layer is decreased. Incidentally, the dielectric constant of the inter-metal dielectric layer is varied with the size of the void and the size of the void can be adjusted to meet the requirement of the devices. The void can be adjusted by controlling the thickness of the flowable dielectric material and the width of the bottom of the spacers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1D are schematic, cross-sectional views of the process for manufacturing an inter-metal dielectric layer.

Figure 1A:
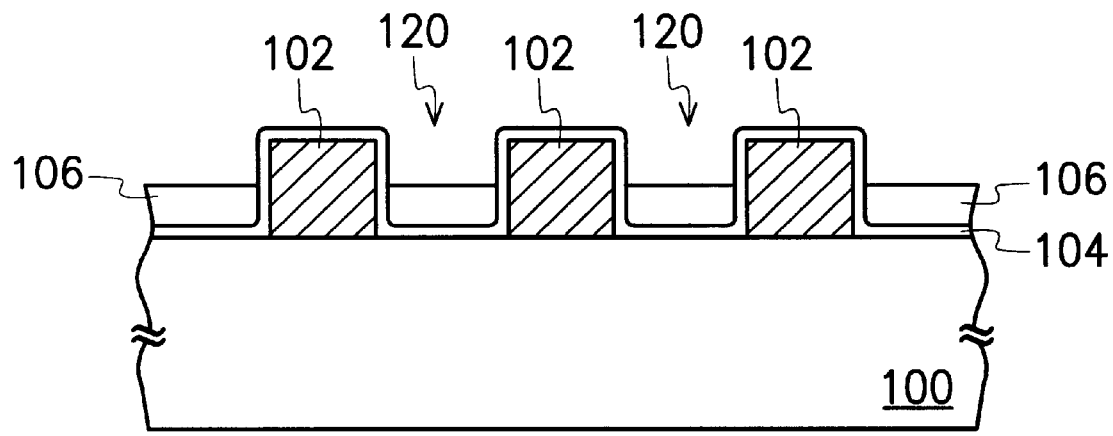
FIGS. 1A through 1D are schematic, cross-sectional views of the process for manufacturing an inter-metal dielectric layer.

As shown in FIG. 1A, a substrate 100 is provided. The substrate 100 can be a silicon substrate and the substrate 100 comprises semiconductor devices (not shown). Wires 102 are formed on the substrate 100. The wires 102 expose a portion of the substrate 100 and a space between the wires 102 is denoted as an opening 120. The method of forming the wires 102 comprise the steps of forming a conductive layer (not shown) on the substrate 100, and then patterning the conductive layer to form the wires 102 by a traditional photolithography and etching process. The conductive layer can be made of aluminum or aluminum alloy, for example.

After that, a conformal liner layer 104 is formed on the substrate 100 and the wires 102. The liner layer 104 can be made of dielectric material such as a silicon oxide-rich dielectric material and the thickness of the liner layer 104 is about 200–300 angstroms, for example. The liner layer 104 is used to avoid a direct connection between wires 102 and the flowable dielectric material formed subsequently, so that the quality of the wires 102 is not affected by the flowable material. A flowable dielectric material 106 is formed in the opening 120. The flowable dielectric material 106 can be made of spin-on polymer or organic spin-on-glass, for example. The surface level of the flowable dielectric material 106 is lower than that of the wires 102; that is, the flowable dielectric material 106 is thinner than the wires 102. Preferably, the thickness of the flowable dielectric material 106 is about 2000–3000 angstroms.

Figure 1B:
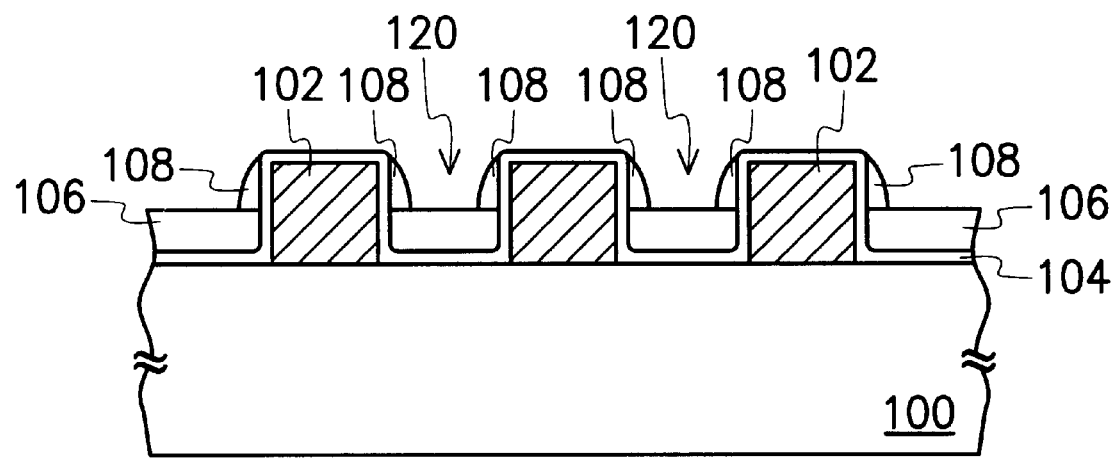

As shown in FIG. 1B, spacers 108 are formed on the liner layer 104 on the sidewalls of the wires 102 exposed by the flowable dielectric material 106, and the spacers 108 are located on the flowable dielectric material 106. The spacers 108 can be made of a dielectric material such as oxide, for example. The method of forming the spacers 108 comprises a step of forming a conformal dielectric layer (not shown) on the liner layer 104 and the flowable dielectric material 106, and then performing an anisotropic etching back process to form the spacers 108 until a portion of the flowable dielectric material 106 is exposed. Additionally, the width of the bottom of the spacer 108 is related to the dielectric constant of the IMD layer formed subsequently. Therefore, the width of the bottom of the spacers 108 can be adjusted by controlling the thickness of the conformal dielectric layer.

Figure 1C:
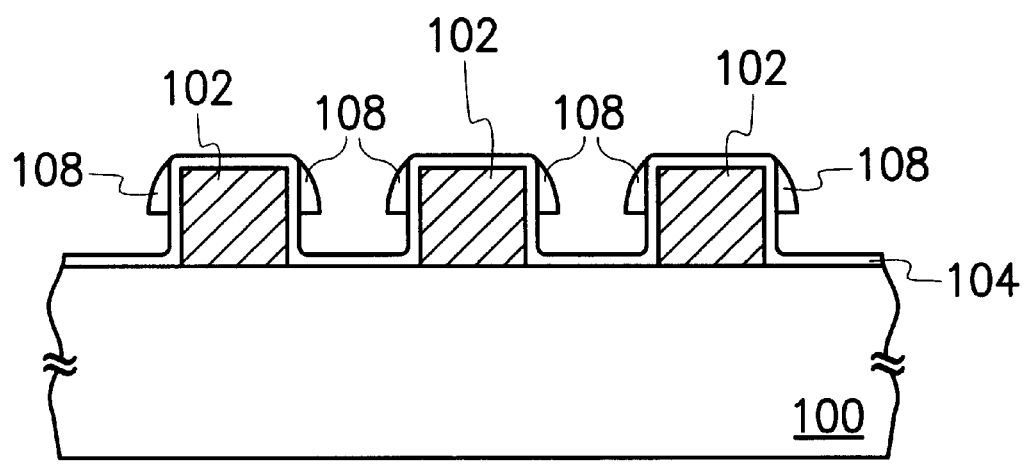

As shown in FIG. 1C, the flowable dielectric material 106 is removed to expose liner layer 104. The flowable dielectric material 106 can be removed by wet etching, for example. An etchant used in the wet etching possesses a high etching selectivity for the flowable dielectric material 106 over the spacers 108 and a high etching selectivity for the flowable dielectric material 106 over the liner layer 104.

Figure 1D:
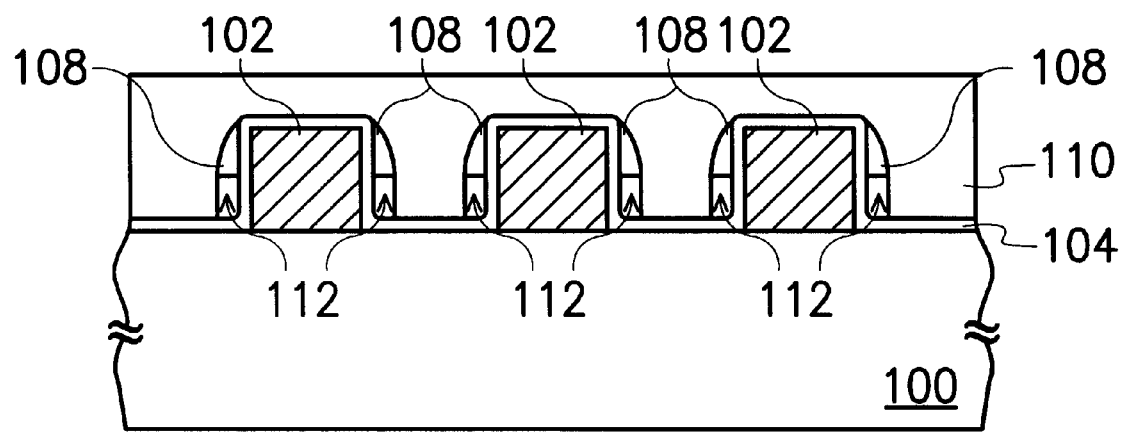

As shown in FIG. 1D, a planarized dielectric layer 110 is formed on the liner layer 104 and the spacers 108. The method of forming the planarized dielectric layer 110 comprises the steps of performing an anisotropic deposition process with a poor lateral-filling ability to form a dielectric layer (not shown) and then performing a planarizing process to form the planarized dielectric layer 110. The anisotropic deposition process can be sputtering and the planarizing process can be chemical-mechanical polishing, for example. Since the planarized dielectric layer 110 is formed by the anisotropic deposition process with a poor-lateral-filling ability, voids 112 are formed under the spacers 108. The size of the voids 112 can be adjusted to meet the requirement of the devices. Moreover, the voids 112 can be adjusted by controlling the thickness of the flowable dielectric material 106 and the width of the bottom of the spacers 108.

Because the dielectric constant of the air in voids 112 is about 1.0, which is lower than that of the silicon oxide, the dielectric constant of the IMD layer including the voids 112 and planarized dielectric layer 110 is decreased. Therefore, the RC time delay is efficiently decreased. Specifically, the dielectric constant of the IMD layer including the voids 112 and planarized dielectric layer 110 can be adjusted by the size of the voids 112. Hence, the dielectric constant of the IMD layer can be increased by increasing the width of the bottom of the spacers 108 or increasing the thickness of the flowable dielectric material 106. Conversely, the dielectric constant of the IMD layer can be decreased by decreasing width of the bottom of the spacers 108 or decreasing the thickness of the flowable dielectric material 106.

Altogether, the invention includes following advantages:

1. In the invention, the IMD layer comprises voids formed between the wires. The dielectric constant of the air in the voids is about 1.0, so the problem of RC time delay between the wires can be overcome, and the efficacy of the devices can be greatly improved.

2. In the invention, the size of the voids can be adjusted to meet the requirement of the devices. The voids can be adjusted by controlling the thickness of the flowable dielectric material between the wires and the width of the bottom of the spacers on the sidewall of the wires exposed the flowable dielectric material.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing an inter-metal dielectric layer, comprising the steps of:

providing a substrate having a plurality of wires formed thereon, wherein a portion of the substrate is exposed to form an opening between the wires;

forming a conformal liner layer on the wires and the substrate;

filling the opening with a flowable dielectric material, wherein a surface level of the flowable dielectric material is lower than that of the wires;

forming a plurality of spacers on the sidewalls of the wires exposed by the flowable dielectric material;

removing the flowable dielectric material; and performing an anisotropic deposition process with a poor lateral-filling ability to form a dielectric layer having voids under the spacers over the substrate, wherein size of the voids is adjusted by controlling a thickness of the flowable dielectric material and a width of the spacer.

2. The method of claim 1, wherein the flowable dielectric material is made of spin-on polymer.

3. The method of claim 1, wherein the flowable dielectric material is made of organic spin-on-glass.

4. The method of claim 1, wherein the spacers are made of oxide.

5. The method of claim 1, wherein the anisotropic deposition process with a poor lateral-filling ability includes sputtering.

6. A method for manufacturing an inter-metal dielectric layer, comprising the steps of:

providing a substrate;

forming a wire with a surface level on the substrate, wherein the wire exposes a portion of the substrate;

forming a flowable dielectric material on the portion of the substrate exposed by the wire, wherein a surface level of the flowable dielectric material is lower than that of the wire;

forming a spacer on the sidewall of the wire exposed by the flowable dielectric material;

removing the flowable dielectric material;

removing the flowable dielectric material; and performing a sputtering to form a dielectric layer with a void under the spacer over the substrate, wherein the size of the void is adjusted by controlling a thickness of the flowable dielectric material and a width of the spacer.

7. The method of claim 6, further comprising a step of forming a liner layer on the wire and the substrate before the step of forming the flowable dielectric material.

8. The method of claim 6, wherein the flowable dielectric material is made of spin-on polymer.

9. The method of claim 6, wherein the flowable dielectric material is made of organic spin-on-glass.

10. The method of claim 6, wherein the spacer is made of oxide.

* * * * *